(12) United States Patent
Sakata

(10) Patent No.: US 10,276,654 B2
(45) Date of Patent: Apr. 30, 2019

(54) SEMICONDUCTOR DEVICE WITH PARALLEL PN STRUCTURES

(71) Applicant: FUJI ELECTRIC CO., LTD., Kawasaki-shi, Kanagawa (JP)

(72) Inventor: Toshiaki Sakata, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 48 days.

(21) Appl. No.: 15/193,398

(22) Filed: Jun. 27, 2016

(65) Prior Publication Data

US 2016/0308037 A1    Oct. 20, 2016

Related U.S. Application Data

(63) Continuation of application No. PCT/JP2015/069362, filed on Jul. 3, 2015.

(30) Foreign Application Priority Data

Jul. 4, 2014  (JP) .................................. 2014-138780

(51) Int. Cl.
*H01L 29/76* (2006.01)
*H01L 29/06* (2006.01)
(Continued)

(52) U.S. Cl.
CPC ...... *H01L 29/0634* (2013.01); *H01L 29/0615* (2013.01); *H01L 29/0619* (2013.01);
(Continued)

(58) Field of Classification Search
CPC ............ H01L 29/7397; H01L 29/0634; H01L 29/7395; H01L 29/0649; H01L 29/0619;
(Continued)

(56) References Cited

U.S. PATENT DOCUMENTS 5,216,275 A   6/1993 Chen
5,438,215 A   8/1995 Tihanyi
(Continued)

FOREIGN PATENT DOCUMENTS

CN  102473721 A  5/2012
JP  H07-7154 A   1/1995
(Continued)

*Primary Examiner* — Shouxiang Hu
(74) *Attorney, Agent, or Firm* — Rabin & Berdo, P.C.

(57) ABSTRACT

A semiconductor device including a substrate, an active portion and a well region both formed in the substrate on a first surface side thereof, and a low-resistivity layer formed in the substrate on a second surface side thereof. A first parallel pn structure is formed in the substrate between the active portion and the low-resistivity layer, the first parallel pn structure having a first region and a second region that are repeatedly alternated at a first repetition pitch. A second parallel pn structure is formed in the substrate between the well region and the low-resistivity layer, the second parallel pn structure having a third region and a fourth region that are repeatedly alternated at a second repetition pitch that is smaller than the first repetition pitch, the well region and the second parallel pn structure being isolated from each other.

14 Claims, 6 Drawing Sheets

(51) Int. Cl.
*H01L 29/78* (2006.01)
*H01L 29/66* (2006.01)
*H01L 29/36* (2006.01)
*H01L 29/739* (2006.01)
*H01L 29/423* (2006.01)
*H01L 29/10* (2006.01)

(52) U.S. Cl.
CPC .......... *H01L 29/0649* (2013.01); *H01L 29/36* (2013.01); *H01L 29/66712* (2013.01); *H01L 29/7395* (2013.01); *H01L 29/7397* (2013.01); *H01L 29/7802* (2013.01); *H01L 29/7811* (2013.01); *H01L 29/1095* (2013.01); *H01L 29/4238* (2013.01)

(58) Field of Classification Search
CPC ......... H01L 29/36; H01L 29/06; H01L 29/78; H01L 29/1095; H01L 29/4238; H01L 29/7811; H01L 29/66712; H01L 29/7802; H01L 29/0615
USPC .................. 257/329, 342, 339, 493
See application file for complete search history.

(56) References Cited

U.S. PATENT DOCUMENTS 6,097,063 A    8/2000  Fujihira
6,674,126 B2*  1/2004  Iwamoto ............. H01L 29/7802
                                                257/341
9,577,087 B2*  2/2017  Onishi ................ H01L 29/0634
2001/0028083 A1  10/2001  Onishi et al.
2002/0027237 A1   3/2002  Onishi et al.
2002/0167020 A1* 11/2002  Iwamoto ................ B82Y 20/00
                                                257/103
2005/0250322 A1  11/2005  Aida et al.
2012/0126315 A1   5/2012  Onishi et al.
2012/0217555 A1   8/2012  Saito et al.
2013/0099347 A1*  4/2013  Tamura ............... H01L 29/7811
                                                257/493
2014/0061644 A1   3/2014  Cao et al.

FOREIGN PATENT DOCUMENTS

| | | |
|---|---|---|
| JP | H09-266311 A | 10/1997 |
| JP | 2001-298191 A | 10/2001 |
| JP | 2002-076339 A | 3/2002 |
| JP | 2003-115589 A | 4/2003 |
| JP | 2004-022716 A | 1/2004 |
| JP | 2005-322700 A | 11/2005 |
| JP | 2011-192824 A | 9/2011 |
| JP | 2012-156333 A | 8/2012 |
| JP | 2012-533167 A | 12/2012 |
| WO | WO-2013-015014 A1 | 1/2013 |

* cited by examiner

SEMICONDUCTOR DEVICE WITH PARALLEL PN STRUCTURES

CROSS REFERENCE TO RELATED APPLICATIONS

This is a continuation application of International Application PCT/JP2015/069362, filed on Jul. 3, 2015, which claims priority from Japanese Patent Application No. 2014-138780, filed on Jul. 4, 2014, the contents of which are incorporated herein by reference.

BACKGROUND OF THE INVENTION

1. Field of the Invention

Embodiments of the present invention relate to a semiconductor device.

2. Description of the Related Art

Semiconductor elements (semiconductor devices) are generally classified into horizontal semiconductor elements having electrodes on a single side, and vertical semiconductor elements each having electrodes on both sides. In a vertical semiconductor element, the direction in which drift current flows during an ON state and the direction in which a depletion layer extends due to reverse bias voltage during an OFF state are the same.

For example, in an ordinary planar-gate n-channel vertical insulated gate field effect transistor (metal oxide semiconductor field-effect transistor (MOSFET)), a portion that is a highly resistive n⁻-type drift layer acts as a region for a drift current to flow therethrough in a vertical direction (the depth direction) during an ON state. When the current path in this n⁻-type drift layer is shortened, the drift resistance is therefore reduced and an effect is thereby achieved that the substantial ON resistance of the MOSFET can be reduced.

On the other hand, a portion forming a highly resistive n⁻-type drift layer has a function of increasing the breakdown voltage by being depleted during the OFF state. When the current path in the n⁻-type drift layer is shortened, the thickness of the n⁻-type drift layer is reduced and the width is therefore reduced within which a drain-base depletion layer spreads out from a pn junction between a p-type base region and the n⁻-type drift layer into the n⁻-type drift layer (the distance that the depletion layer extends in the vertical direction). The critical electric field strength of silicon is therefore rapidly reached and the breakdown voltage is thereby reduced. On the contrary, in a semiconductor element whose breakdown voltage is high, the thickness of the n⁻-type drift layer is large and the ON resistance is therefore high. The loss is therefore increased. As described, a trade-off relation is present between the ON resistance and the breakdown voltage.

It is known that this trade-off relation also exists in semiconductor elements such as an insulated gate bipolar transistor (IGBT), a bipolar transistor, a diode, and the like. This trade-off relation is also common to the horizontal semiconductor element in which the direction in which drift current flows during an ON state and the direction in which a depletion layer extends due to reverse bias voltage during an OFF state differ from each other.

To solve the problems associated with the trade-off relation, one semiconductor element has a drift layer that has a parallel pn structure configured to include junctions formed by alternately arranging an n-type drift region whose impurity concentration is increased and a p-type partition region, repeatedly (hereinafter, referred to as "super-junction semiconductor element") (see, e.g., U.S. Pat. Nos. 5,216,275 and 5,438,215, and Japanese Laid-Open Patent Publication No. H9-266311). In a semiconductor element having this structure, even when the impurity concentration of the parallel pn structure is high, the depletion layer spreads in the horizontal direction (the direction in which the n-type drift regions and the p-type partition regions are alternately arranged repeatedly) from each of the pn junctions each extending in the vertical direction of the parallel pn structure to cause the overall drift layer to be depleted during the OFF state. Realization of a higher breakdown voltage can therefore be facilitated.

A super-junction semiconductor element has been proposed that has a parallel pn structure whose pitch is smaller than that of the parallel pn structure of an element active portion disposed in a portion immediately beneath the edge termination structure surrounding an outer perimeter of the parallel pn structure of the element active portion or a gate output electrode disposed in near a border between the element active portion and the edge termination structure (see, e.g., Japanese Laid-Open Patent Publication Nos. 2012-156333, 2004-022716, and 2001-298191). Another super-junction semiconductor element has also been proposed that has the portion immediately beneath the gate output electrode set to be an n⁻-type region (see, e.g., Japanese Laid-Open Patent Publication No. 2005-322700). In a super-junction semiconductor element having this structure, realization of a higher breakdown voltage of the edge termination structure can be facilitated compared to that of the element active portion, and the avalanche resistance is improved.

In the super-junction semiconductor element described in Japanese Laid-Open Patent Publication No. 2001-298191, a pn junction formed by the n-type drift region on the outermost side of the parallel pn structure of the element active portion and the p-type partition region on the outer side thereof is connected to a p-type well region disposed at a portion immediately beneath the gate output electrode. Occurrence of dynamic avalanche breakdown (dynamic avalanche breakdown) thereby may be avoided and a stable breakdown voltage can therefore be ensured. Furthermore, a charge balance can be established between the p-type partition region on the outermost side of the parallel pn structure of the element active portion and the n-type drift region on the innermost side of the parallel pn structure of the portion immediately beneath the gate output electrode.

With the super-junction semiconductor element described in Japanese Laid-Open Patent Publication No. 2001-298191, however, during ON operation of the super-junction semiconductor element, a portion on the parallel pn structure side of the portion immediately beneath the gate output electrode cannot be used at all as a current path in the junction portion between the parallel pn structure of the element active portion and the parallel pn structure of the portion immediately beneath the gate output electrode, and the ON resistance increases. Concentration of the current tends to occur because the current path is narrowed. A problem therefore arises in that the trade-off relation between the ON resistance and the breakdown voltage is degraded.

SUMMARY OF THE INVENTION

According to one aspect of the present invention, a semiconductor device includes an active portion on a first surface side of a substrate, the active portion actively or passively passing current therethrough; a first electrode conductively connected to the active portion; a low-resistivity layer of a first conductivity type and disposed on a second surface side of the substrate; a second electrode conductively connected to the low-resistivity layer; a vertical drift portion disposed between the active portion and the low-resistivity layer, and through which drift current flows in a vertical direction during an ON state, the vertical drift portion becoming depleted during an OFF state; a first parallel pn structure having junctions formed by repeated alternating arrangement of a first vertical region of the first conductivity type and a second vertical region of a second conductivity type, the first and the second vertical regions being oriented in a thickness direction of the substrate, at a first repetition pitch in the vertical drift portion; a third electrode disposed on a first surface via an insulation film, and used in ON/OFF control; and a well region of the second conductivity type and disposed on the first surface side, in a surface layer immediately beneath the third electrode, the well region being electrically connected to the first electrode. The well region and the low-resistivity layer have therebetween, a second parallel pn structure disposed contiguously with the first parallel pn structure and having junctions formed by repeated alternating arrangement of a third vertical region of the first conductivity type and a fourth vertical region of the second conductivity type, the third and the fourth vertical regions being oriented in the thickness direction of the substrate, at a second repetition pitch that is smaller than the first repetition pitch. A first semiconductor region of the first conductivity type is disposed between the well region and the second parallel pn structure, and isolates the well region and the second parallel pn structure from each other.

In the semiconductor device, a thickness of the first semiconductor region is at most ⅓ of a thickness of the first parallel pn structure.

In the semiconductor device, a thickness of the first semiconductor region is at least a width of the fourth vertical region.

In the semiconductor device, an impurity concentration of the first semiconductor region is lower than an impurity concentration of the third vertical region.

In the semiconductor device, an end of the first electrode extends onto the insulation film and on the insulation film, at least a portion of the first electrode is in proximity to the third electrode.

The semiconductor device further includes an edge termination structure disposed between a first surface and the low-resistivity layer, at a periphery of the vertical drift portion, the edge termination structure being a non-current path region during an ON state and being depleted during an OFF state. The edge termination structure is a third parallel pn structure having junctions formed by repeated alternating arrangement of a fifth vertical region of the first conductivity type and a sixth vertical region of the second conductivity type, the fifth and the sixth vertical regions being oriented in the thickness direction of the substrate, at a third repetition pitch that is smaller than the first repetition pitch.

The semiconductor device further includes a second semiconductor region of the first conductivity type and disposed between the well region and the third parallel pn structure, the second semiconductor region isolating the well region and the third parallel pn structure from each other.

In the semiconductor device, a thickness of the second semiconductor region is at most ⅓ of a thickness of the first parallel pn structure.

In the semiconductor device, a thickness of the second semiconductor region is at least a width of the sixth vertical region.

In the semiconductor device, an impurity concentration of the second semiconductor region is lower than an impurity concentration of the fifth vertical region.

In the semiconductor device, the second vertical region of the first parallel pn structure and the well region contact each other.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
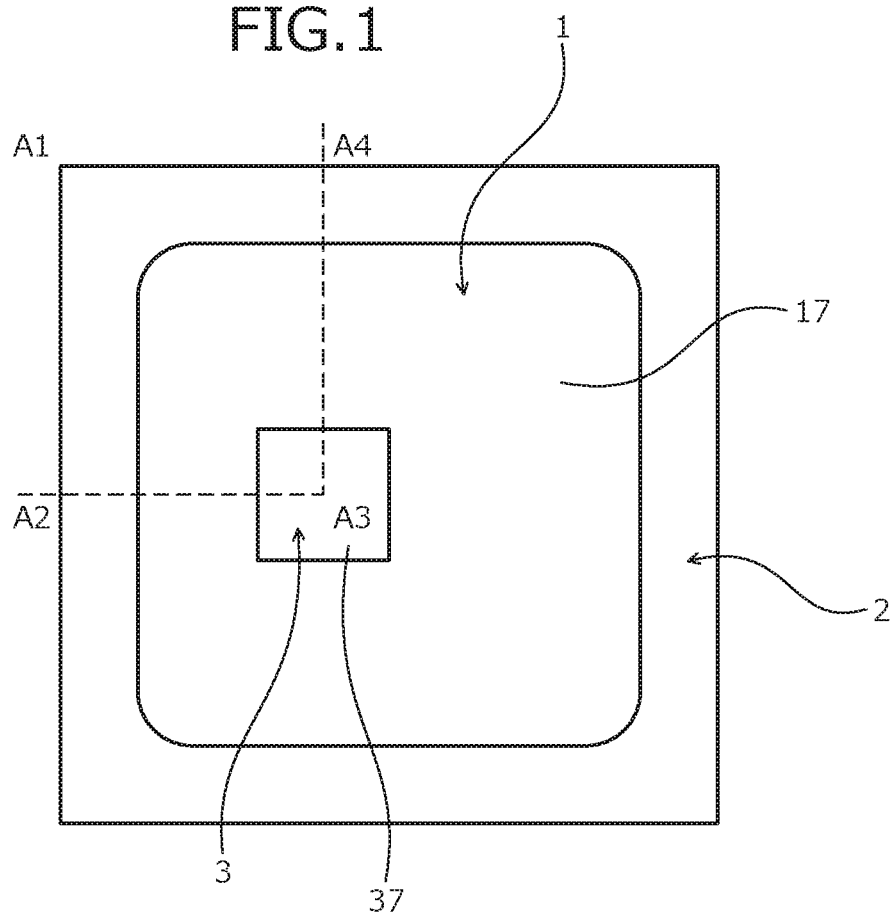
FIG. 1 is a plan diagram of a chip of a vertical MOSFET element according to an embodiment.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

Figure 2:
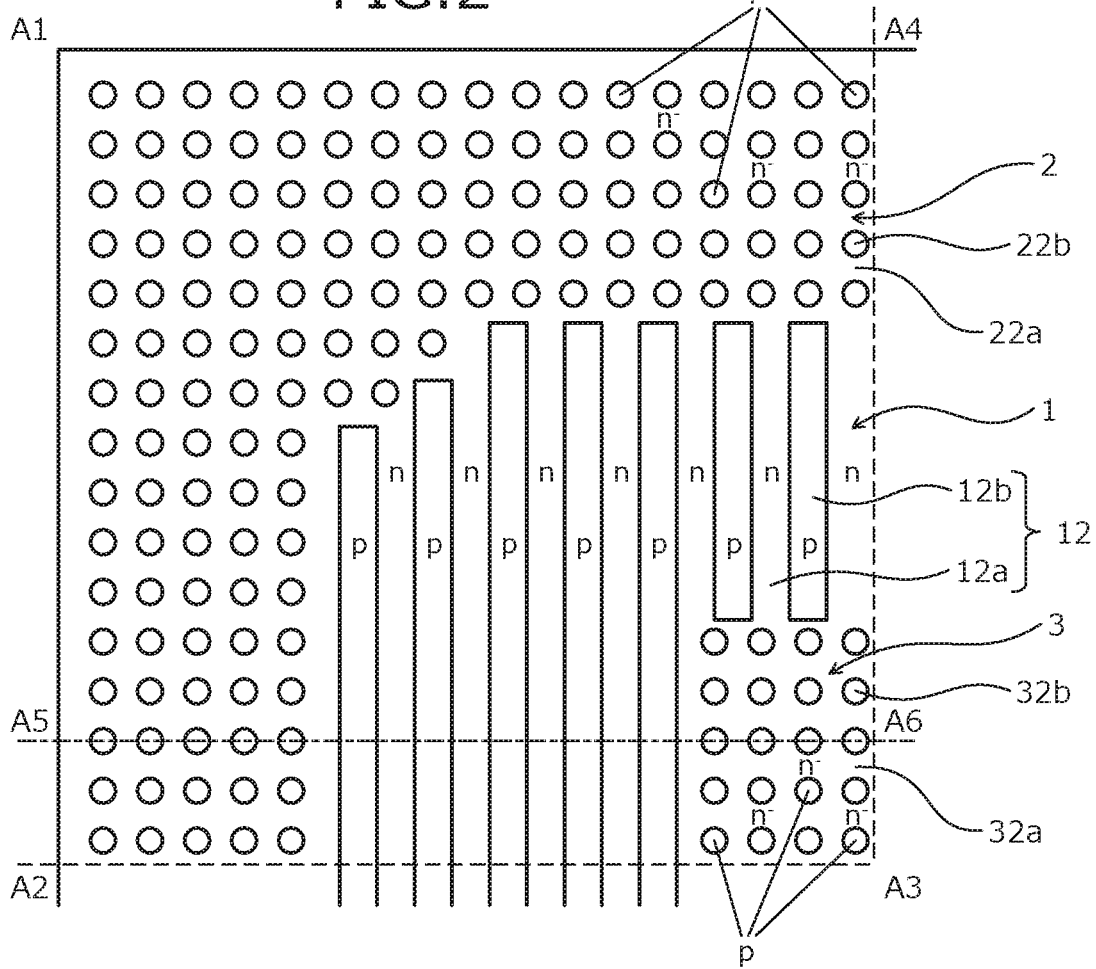
FIG. 2 is an enlarged plan diagram of a region defined by reference points A1 to A4 in FIG. 1.
Figure 3:
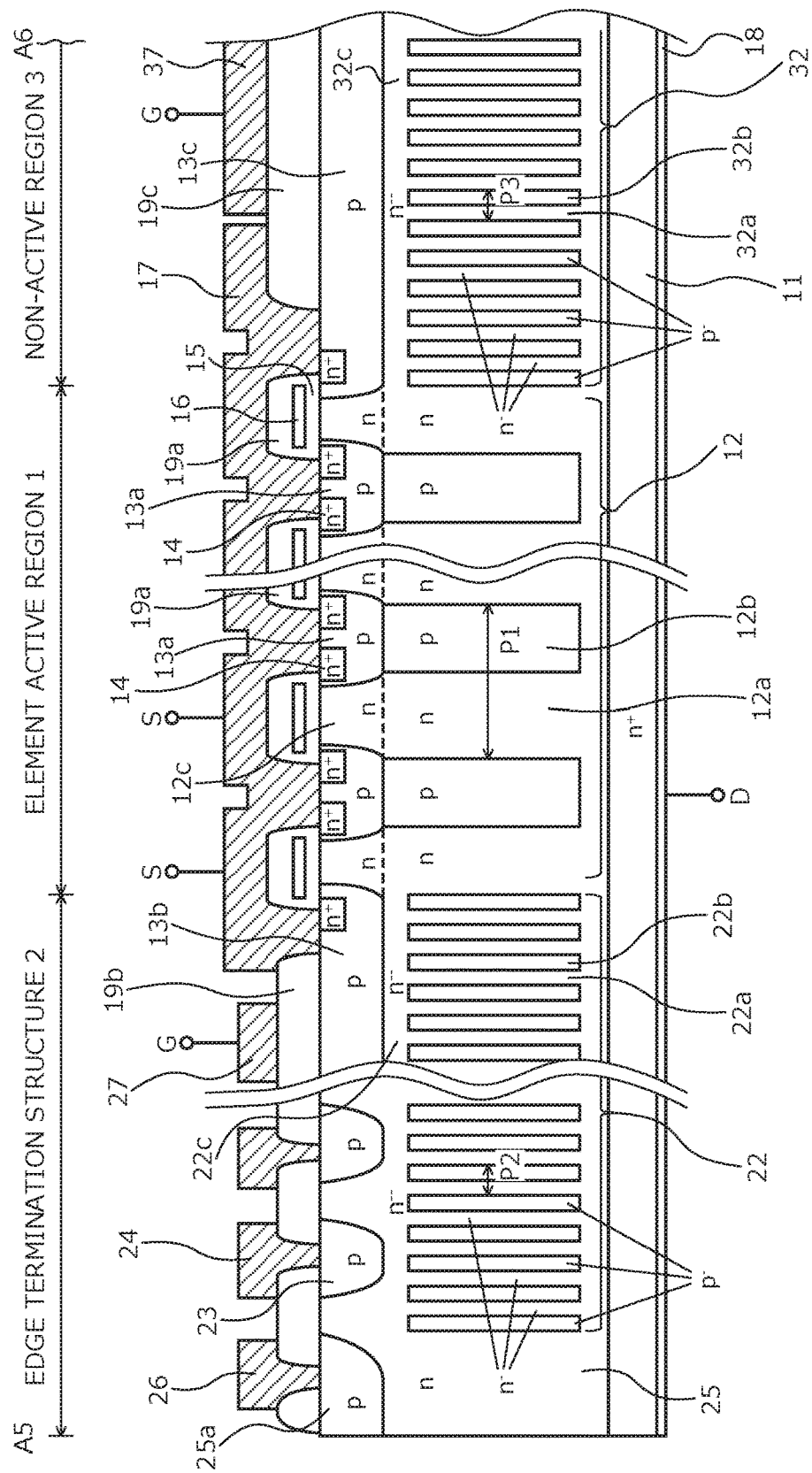
FIG. 3 is a cross-sectional view of the vertical MOSFET element along cutting line A5-A6 in FIG. 2.

A structure of the semiconductor device according to an embodiment will be described taking an example of an re-channel vertical MOSFET. FIG. 1 is a plan diagram of a chip of the vertical MOSFET element according to the embodiment. FIG. 2 is an enlarged plan diagram of a region defined by reference points A1 to A4 in FIG. 1. FIG. 2 schematically depicts a planar structure of an area that is substantially ¼ of the semiconductor chip depicted in FIG. 1. FIG. 3 is a cross-sectional view of the vertical MOSFET element along cutting line A5-A6 in FIG. 2. As depicted in FIG. 1, the semiconductor device according to the embodiment includes, on a semiconductor chip (a semiconductor substrate), an element active region 1 through which a current flows during the ON state, and an edge termination structure 2 that maintains breakdown voltage by mitigating the electric field on the chip front surface side.

A MOS gate (an insulated gate including a metal oxide semiconductor) structure not depicted is disposed in the element active region 1 on the chip front surface side. A source pad (a first electrode) 17 is disposed on the MOS gate structure, via an interlayer insulation film not depicted. A gate pad (a third electrode) 37 is disposed on an opposite side of the source pad 17 with respect to an edge termination side of the source pad 17. The region having the gate pad 37 disposed therein is a non-active region 3 void of a MOS gate structure.

The edge termination structure 2 is disposed to surround the periphery of the element active region 1 and is mostly a non-current path region during the ON state. A gate pad (a third electrode, see a reference numeral "27" in FIG. 3) of the edge termination structure 2 is disposed to surround the element active region 1 near the border with the element active region 1. A drain electrode (a second electrode, not depicted) is disposed on a chip back surface.

A planar structure of the semiconductor device according to the embodiment will be described with reference to FIG. 2. FIG. 2 depicts the planar structure at a depth of about ½ of the depth of a drift portion of the element active region 1 (a depth of about ½ of the thickness of the drift portion in the depth direction from the interface of a p-type base region 13a and a first p-type region 12b described later).

As depicted in FIG. 2, in the element active region 1, a first parallel pn structure (a first parallel pn structure) 12 is disposed in the drift portion and is configured to include junctions formed by repeated alternating arrangement of a first n-type region (a first vertical region of a first conductivity type) 12a and a first p-type region (a second vertical region of a second conductivity type) 12b whose impurity concentrations are raised. The first parallel pn structure 12 has a planar layout in which the first parallel pn structure is disposed in stripes extending in a direction orthogonal to the direction in which the first n-type regions 12a and the first p-type regions 12b are arranged side by side.

At a periphery of the drift portion of the first parallel pn structure 12 is the edge termination structure 2 configured by a second parallel pn structure (a third_parallel pn repetition structure) 22 having junctions formed by repeated alternating arrangement of a second n--type region (a fifth vertical region of the first conductivity type) 22a and a second p--type region (a sixth vertical region of the second conductivity type) 22b, repeatedly. A second parallel pn structure 22 is disposed contiguously with the first parallel pn structure 12 and at the border with the first parallel pn structure 12, contacts the first n-type region 12a.

A repetition pitch (a third repetition pitch) P2 of the second parallel pn structure 22 is less than a repetition pitch (a first repetition pitch) P1 of the first parallel pn structure 12. The second parallel pn structure 22 has a planar layout in which, for example, the second p⁻-type regions 22b are disposed in a matrix shape in the second n⁻-type region 22a (i.e., the second n⁻-type region 22a has a substantially lattice shape). The planar shape of each of the second p⁻-type regions 22b may be, for example, a dot.

On an opposite side of the drift portion of the first parallel pn structure 12 with respect to an edge termination structure side of the drift portion is the non-active region 3, which includes a third parallel pn structure (a second parallel pn repetition structure) 32 configured to include junctions formed by repeated alternating arrangement of a third n--type region (a third vertical region of the first conductivity type) 32a and a third p--type region (a fourth vertical region of the second conductivity type) 32b. The third parallel pn structure 32 is disposed immediately beneath a gate pad 37 and contiguously with the first parallel pn structure 12, contacting the first n-type region 12a at the border with the first parallel pn structure 12.

A repetition pitch (a second repetition pitch) P3 of the third parallel pn structure 32 is smaller than the repetition pitch P1 of the first parallel pn structure 12. The third parallel pn structure 32 has a planar layout in which, for example, the third p⁻-type regions 32b are disposed in a matrix shape in the third n⁻-type region 32a (i.e., the third n⁻-type region 32a has a substantially lattice shape). The planar shape of each of the third p⁻-type regions 32b may be, for example, a dot.

A cross-sectional structure of the semiconductor device according to the embodiment will be described with reference to FIG. 3. As depicted in FIG. 3, in the element active region 1, the first parallel pn structure 12 is disposed on the n⁺-type drain layer (a low-resistivity layer) 11, which has a low resistivity and conductively contacts a drain electrode 18 disposed on a back surface side of the semiconductor chip. The first parallel pn structure 12 has a cross-sectional structure including the junctions formed by repeated alternating arrangement of the first n-type region 12a and the first p-type region 12b, respectively oriented vertically in a direction of thickness (the depth direction) of the chip (the substrate) to form vertically oriented layers, the first n-type region 12a and the first p-type region 12b being arranged at the repetition pitch P1 in a direction parallel to the chip surface.

The first n-type region 12a and the first p-type region 12b roughly correspond to a portion immediately beneath the p-type base region 13a of the plural wells that form an active portion and are disposed in a surface layer region that is on the chip front surface side in the element active region 1. The first n-type region 12a and the first p-type region 12b function as the drift portion (a vertical drift portion) of the element active region 1. An upper end of the first n-type region 12a (the end on the chip front surface side) reaches a sandwiched region (an n-type region sandwiched between adjacent p-type base regions 13a) 12c. The first n-type region 12a becomes a current path during the ON state. An upper end of the first p-type region 12b contacts a well bottom (a surface on the n⁺-type drain layer 11 side) of the p-type base region 13a.

An n⁺-type source region 14 is selectively disposed in the p-type base region 13a, on the chip front surface side. A gate electrode 16 is disposed, via a gate insulation film 15, on the surface of the p-type base region 13a, at the portion between the first n-type region 12a and the n⁺-type source region 14. In a portion not depicted, the gate electrode 16 electrically contacts the gate pads 27 and 37 to control ON and OFF.

The source electrode (the source pad) 17 conductively contacts the p-type base regions 13a, 13b, 13c, and the n⁺-type source region 14 via a contact hole of an interlayer insulation film 19a, and is electrically isolated from the gate electrode 16 by the interlayer insulation film 19a. An outer end (end nearest the p-type base region 13b) of the source electrode 17 extends onto an interlayer insulation film 19b and faces the gate pad 27 disposed on the interlayer insulation film 19b. An inner end (end nearest the p-type base region 13c) of the source electrode 17 extends onto an interlayer insulation film 19c and on the interlayer insulation film 19c, at least a portion of the source electrode 17 is in proximity to the gate pad 37. At least a portion of each of the gate pads 27 and 37 is disposed at a position in proximity to the source electrode 17.

In a periphery of the drift portion of the first parallel pn structure 12, the second parallel pn structure 22 configuring the edge termination structure 2 is disposed on the n⁺-type drain layer 11, in succession with the first parallel pn structure 12. The second parallel pn structure 22 has a cross-sectional structure that includes junctions formed by repeated alternating arrangement of the second n⁻-type region 22a and the second p⁻-type region 22b that are oriented vertically in the direction of thickness of the chip to form vertically oriented layers, the second n⁻-type region 22a and the second p⁻-type region 22b being arranged at the repetition pitch P2, in a direction parallel to the chip surface. The impurity concentration of the second parallel pn structure 22 is lower than the impurity concentration of the first parallel pn structure 12 and the repetition pitch P2 is smaller than the repetition pitch P1.

In a surface region on the chip front surface side in the edge termination area 2, an n⁻⁻-type surface region (a second semiconductor region of the first conductivity type) 22c is disposed on the second parallel pn structure 22. The impurity concentration of the n⁻⁻-type surface region 22c is lower than the impurity concentration of the second n⁻-type region 22a. The p-type base region (hereinafter, "p-type well region") 13b, which is disposed on an edge termination structure 2 side of the element active region 1, extends into the n⁻⁻-type surface region 22c.

The thickness of the n⁻⁻-type surface region 22c (the depth from the chip front surface) is greater than the thickness of the p-type well region 13b. The n⁻⁻-type surface region 22c covers the overall region beneath the p-type well region 13b (the region on the n⁺-type drain layer side). The n⁻⁻-type surface region 22c isolates the p-type well region 13b and the second parallel pn structure 22 from each other. A portion between the p-type well region 13b and the second parallel pn structure 22 of the n⁻⁻-type surface region 22c thereby functions as a current path during the ON state. An advantageous lower limit value of the thickness of the n⁻⁻-type surface region 22c will be described later.

The thickness of the portion between the p-type well region 13b and the second parallel pn structure 22 of the n⁻⁻-type surface region 22c may be equal to or less than ⅓ of the thickness of the first parallel pn structure 12. The reason for this is as follows. When the thickness of the portion between the p-type well region 13b and the second parallel pn structure 22 of the n⁻⁻-type surface region 22c exceeds ⅓ of the thickness of the first parallel pn structure 12, the thickness of the second parallel pn structure 22 is too thin relative to the thickness of the first parallel pn structure 12, whereby the charge balance may be lost.

Therefore, when avalanche breakdown occurs, the electric field becomes higher in the edge termination structure 2 than in the element active region 1. In a worst case, the electric field concentrates at the edge termination structure 2 and a phenomenon like secondary breakdown of a parasitic pnp transistor including the p-type well region 13b, the n⁻⁻-type surface region 22c, and the second p⁻-type region 22b may occur, leading to breakdown. In this case, to prevent element breakdown, the breakdown voltage of the element active region 1 needs to be kept low, whereby the realization of a higher breakdown voltage becomes difficult and the trade-off relation between the element breakdown voltage BV and the ON resistance RonA degrades.

Inside the n⁻⁻-type surface region 22c, guard rings 23 are disposed on the outer side of the p-type well region 13b and away from the p-type well region 13b. Each of the guard rings 23 conductively contacts a field plate electrode 24. An n-type channel stopper region 25 conductively contacting the n⁺-type drain layer 11 is disposed in an outer periphery of the edge termination structure 2. A p-type region 25a is disposed on the chip front surface side, inside the n-type channel stopper region 25 and a stopper electrode 26 conductively contacts the p-type region 25a. The gate pad 27 is disposed on the p-type well region 13b, via the interlayer insulation film 19b.

On a non-active region 3 side of the element active region 1, the third parallel pn structure 32 configuring the non-active region 3 is disposed on the n⁺-type drain layer 11, in succession with the first parallel pn structure 12. The third parallel pn structure 32 has a cross-sectional structure that includes junctions formed by repeated alternating arrangement of the third n⁻-type region 32a and the third p⁻-type region 32b that are oriented vertically in the direction of thickness of the chip to form vertically oriented layers, the third n⁻-type region 32a and the third p⁻-type region 32b being arranged at the repetition pitch P3, in a direction parallel to the chip surface. The impurity concentration of the third parallel pn structure 32 is lower than the impurity concentration of the first parallel pn structure 12 and the repetition pitch P3 is smaller than the repetition pitch P1.

In a surface layer region on the chip front surface side in the non-active region 3, an n⁻⁻-type surface layer region (a first semiconductor region of the first conductivity type) 32c is disposed on the third parallel pn structure 32. The impurity concentration of an n⁻⁻-type surface region 32c is lower than the impurity concentration of the third n⁻-type region 32a. The p-type base region (the p-type well region) 13c disposed on the non-active region 3 side of the element active region 1 extends into the n⁻⁻-type surface region 32c. The gate pad 37 is disposed on a p-type well region 13c, via the interlayer insulation film 19c.

The thickness of the n⁻⁻-type surface region 32c (the depth from the chip front surface) is larger than the thickness of the p-type well region 13c. The n⁻⁻-type surface region 32c covers the overall region beneath the p-type well region 13c (the region on the n⁺-type drain layer side). The n⁻⁻-type surface region 32c isolates the p-type well region 13c and the third parallel pn structure 32 from each other.

The portion between the p-type well region 13c and the third parallel pn structure 32 of the n⁻⁻-type surface region 32c thereby functions as a current path during the ON state. An advantageous lower limit value of the thickness of the n⁻⁻-type surface region 32c will be described hereinafter. The thickness of the portion between the p-type well region 13c and the third parallel pn structure 32 of the n⁻⁻-type surface region 32c may be equal to or smaller than ⅓ of the thickness of the first parallel pn structure 12. The reason for this is as follows.

When the thickness of the n⁻⁻-type surface region 32c exceeds ⅓ of the thickness of the first parallel pn structure 12, the thickness of the third parallel pn structure 32 is too thin relative to the thickness of the first parallel pn structure 12, whereby the charge balance may to be lost. The electric field therefore becomes higher in the non-active region 3 than in the element active region 1.

In a worst case, the electric field concentrates at the non-active region 3 and a phenomenon like secondary breakdown of a parasitic pnp transistor including the p-type well region 13c, the n⁻⁻-type surface region 32c, and the third p⁻-type region 32b may occur, leading to breakdown. In this case, to prevent element breakdown, the breakdown voltage of the element active region 1 needs to be kept low, whereby realization of a higher breakdown voltage becomes difficult and the trade-off relation between the element breakdown voltage BV and the ON resistance RonA degrades.

The depletion layer extending from the pn junction between the first n-type region 12a and the first p-type region 12b configuring the first parallel pn structure 12 tends to spread out toward the edge termination structure 2 and the non-active region 3 consequent to the repetition pitches P2 and P3 of the second and the third parallel pn structures 22 and 32 being smaller than the repetition pitch P1 of the first parallel pn structure 12 as described. Realization of a higher breakdown voltage is thereby facilitated for the initial breakdown voltage in the initial state (before the accumulation of ions).

The second and the third p-type regions 22b and 32b each achieve an action similar to that of the guard ring until the depletion is completed. The electric fields of the second and the third n-type regions 22a and 32a whose pitches are small, are relaxed, facilitating realization of a higher breakdown voltage. For example, an n-type buffer region is disposed between the first to the third parallel pn structures 12, 22, and 32, and the n-type drain layer 11.

Although not especially limited hereto, when the vertical MOSFET of the embodiment is to have, for example, a breakdown voltage of 600 V, the following values are taken as the dimensions of the components thereof and the impurity concentrations thereof. The thickness (in the depth direction) of the drift portion, that is, the thickness of the first parallel pn structure 12 of the element active region 1 is 44.0 µm. The widths of the first n-type region 12a and the first p-type region 12b are each 6.0 µm (the repetition pitch P1 is 12.0 µm) and the impurity concentrations of the first n-type region 12a and the first p-type region 12b are each $3.0 \times 10^{15}$ cm$^{-3}$.

The widths of the second n$^-$-type region 22a and the second p$^-$-type region 22b constituting the second parallel pn structure 22 of the edge termination structure 2 are each 4.0 µm (the repetition pitch P2 is 8.0 µm). The impurity concentrations of the second n$^-$-type region 22a and the second p$^-$-type region 22b are each $1.0 \times 10^{15}$ cm$^{-3}$. The impurity concentration and the thickness (the depth from the chip front surface) of the n$^{--}$-type surface region 22c, which is the surface drift region of the edge termination structure 2, respectively are $5.0 \times 10^{14}$ cm$^{-3}$ and 5.0 µm.

The widths of the third n$^-$-type region 32a and the third p$^-$-type region 32b constituting the third parallel pn structure 32 of the non-active region 3 are each 4.0 µm (the repetition pitch P3 is 8.0 µm). The impurity concentrations of the third n$^-$-type region 32a and the third p$^-$-type region 32b are each $1.0 \times 10^{15}$ cm$^{-3}$. The impurity concentration and the thickness of the n$^{--}$-type surface region 32c that is the surface drift region of the non-active region 3 respectively are $5.0 \times 10^{14}$ cm$^{-3}$ and 5.0 µm. The diffusion depths of the p-type base region 13a and the p-type well region 13b are each 3.0 µm and the surface impurity concentration thereof is $3.0 \times 10^{17}$ cm$^{-3}$.

The diffusion depth of the n$^+$-type source region 14 is 1.0 µm and the surface impurity concentration thereof is $3.0 \times 10^{20}$ cm$^{-3}$. The diffusion depths of the sandwiched region 12c, which is the surface drift region, is 2.5 µm and the surface impurity concentration thereof is $2.0 \times 10^{16}$ cm$^{-3}$. The thickness of the n$^+$-type drain layer 11 is 200 µm and the impurity concentration thereof is $2.0 \times 10^{18}$ cm$^{-3}$. The width of the n-type channel stopper region 25 is 25.0 µm and the impurity concentration thereof is $4.0 \times 10^{15}$ cm$^{-3}$. The impurity concentration of the p-type region 25a is $3.0 \times 10^{17}$ cm$^{-3}$.

The impurity concentration distribution of each of the first parallel pn structure 12, the second parallel pn structure 22, and the third parallel pn structure 32 may be an impurity concentration distribution to be p-rich (the p-type impurities are relatively dominant) on a side close to the chip front surface (the upper side in the drawing) and to be n-rich (the n-type impurities are relatively dominant) on a side close to the n$^+$-type drain layer 11 (the lower side in the drawing). Each of the impurity concentrations (the impurity amounts) of the parallel pn structures in the above means the carrier concentration (the carrier amount).

Even when the impurity concentration is high, no sufficient improvement for avalanche resistance can be achieved if the carrier concentration is low. The impurity concentration and the carrier concentration can generally be regarded to be equivalent to each other in the region for which sufficient activation is executed. Similarly, the impurity amount and the carrier amount may be regarded to be equivalent to each other in the region for which sufficient activation is executed. For convenience, it is therefore assumed herein that the impurity concentration includes the carrier concentration and the impurity amount includes the carrier amount.

Figure 4:
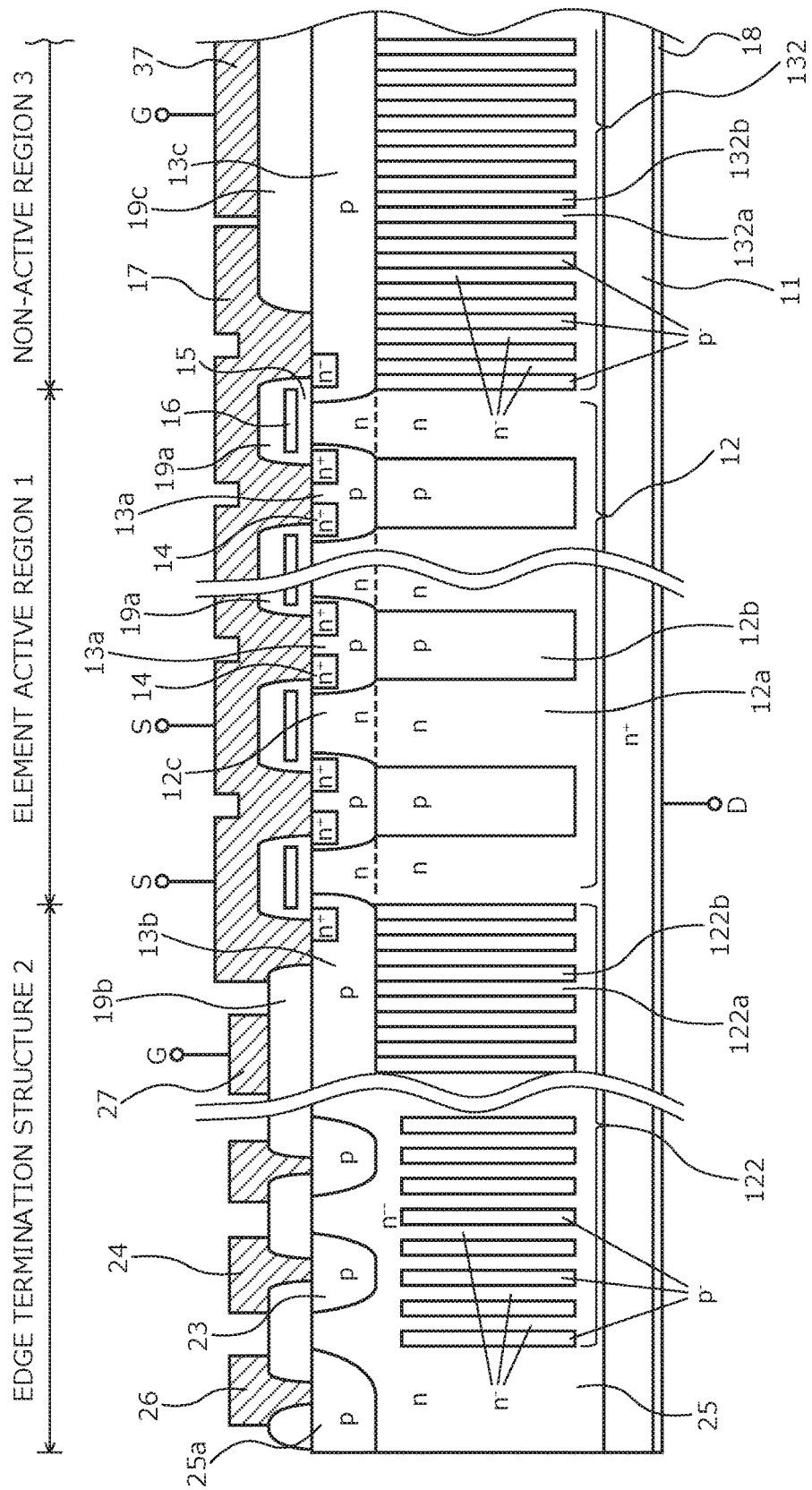
FIG. 4 is a cross-sectional diagram of a structure of a semiconductor device of Comparative Example.

An advantageous lower limit value of the thicknesses of the n$^{--}$-type surface regions 22c and 32c will be described with reference to a comparison of the current path for the difference thereof between the semiconductor device according to the embodiment (hereinafter, referred to as "Example") and Comparative Example that does not have the n$^{--}$-type surface regions 22c and 32c disposed therein. FIG. 4 is a cross-sectional diagram of a structure of the semiconductor device of Comparative Example. FIG. 4 depicts the cross-sectional structure along a portion that corresponds to cutting line A5 to A6 in FIG. 2. Comparative Example differs from Example in that Comparative Example does not have the n$^{--}$-type surface regions 22c and 32c, and has a second parallel pn structure 122 and the p-type well region 13b that contact each other, and a third parallel pn structure 132 and the p-type well region 13c that contact each other.

Figure 5:
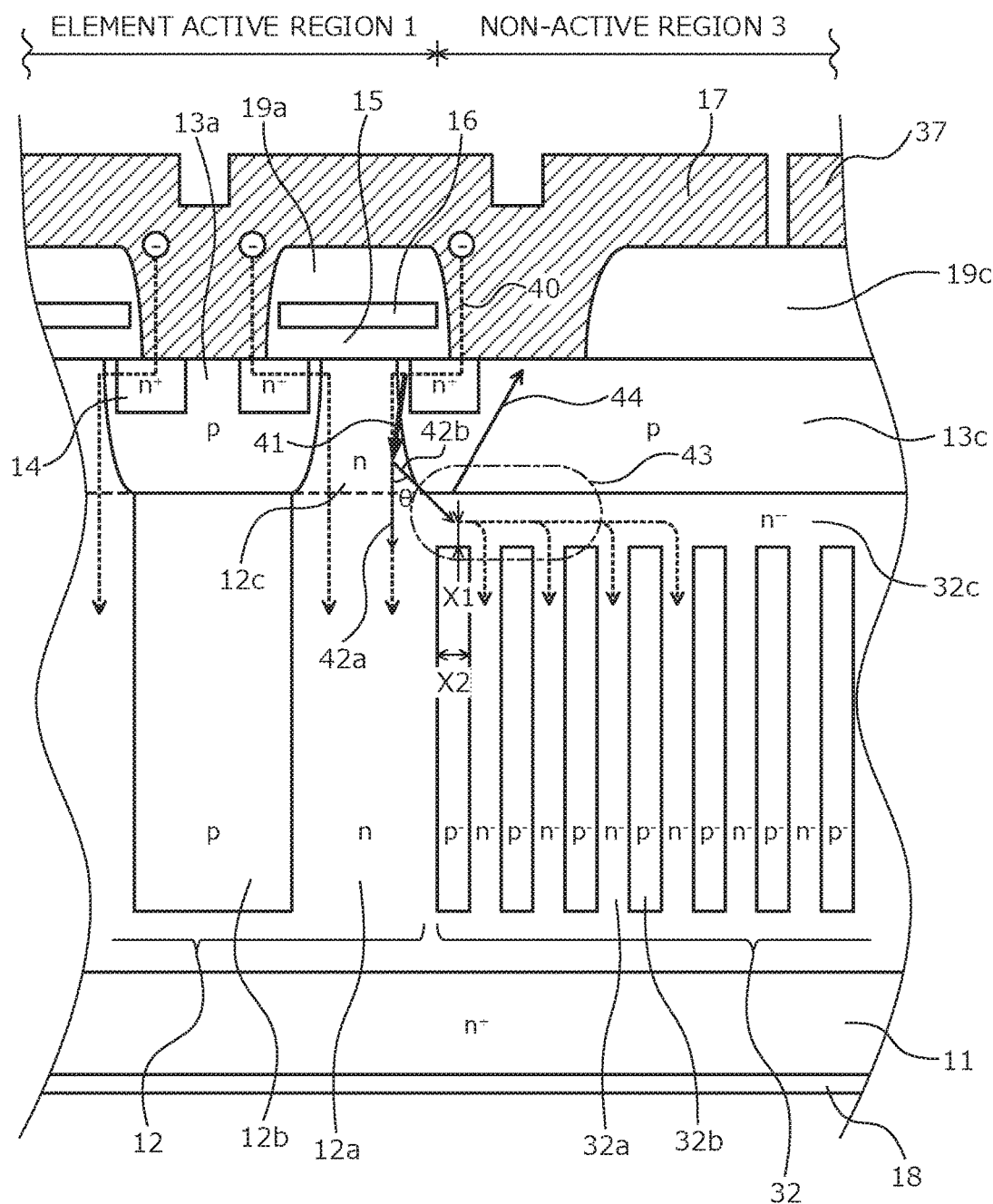
FIG. 5 is a schematic diagram of a current path taken during operation of a semiconductor device according to Example.
Figure 6:
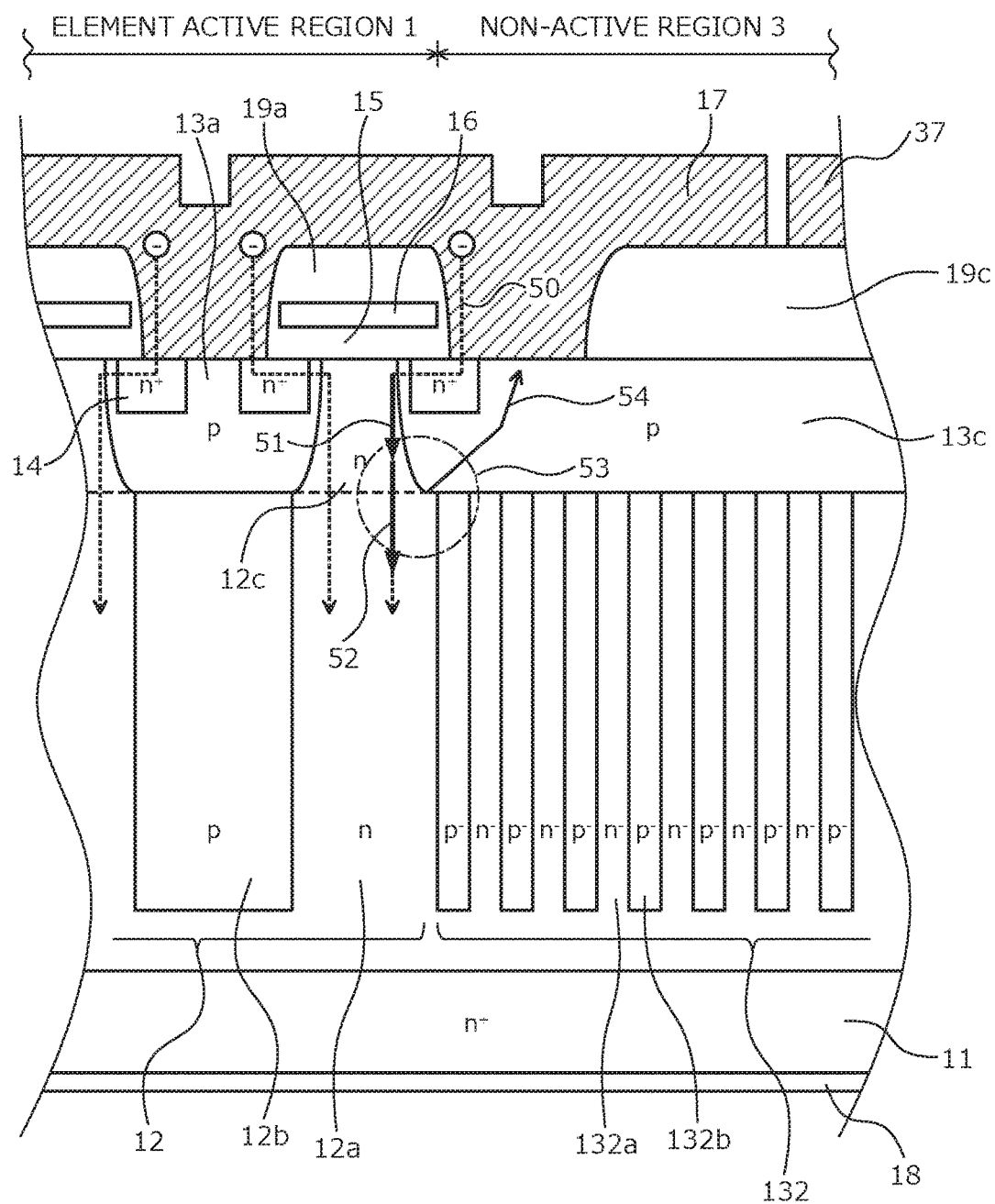
FIG. 6 is a schematic diagram of a current path taken during operation of the semiconductor device according to Comparative Example.

A lower limit value of the thickness of the n$^{--}$-type surface region 32c will be described taking an example of the current path taken during the ON state, at a vicinity of the gate pad 37 (near the border between the element active region 1 and the non-active region 3). FIG. 5 is a schematic diagram of the current path taken during the operation of the semiconductor device according to Example. FIG. 6 is a schematic diagram of a current path taken during the operation of the semiconductor device according to Comparative Example. In FIGS. 4 and 6, reference numerals "122a" and "122b" respectively denote a second n$^-$-type region 122a and a second p$^-$-type region 122b that constitute the second parallel pn structure 122, and reference numerals "132a" and "132b" respectively denote a third n$^-$-type region 132a and a third p$^-$-type region 132b that constitute the third parallel pn structure 132.

As depicted in FIG. 6, in Comparative Example, the p-type well region 13c and the third parallel pn structure 132 contact each other. An electric current 50, which takes an n-type inversion layer formed in the p-type well region 13c during the ON state as a current path, flows only through the first n-type region 12a that contacts the third p$^-$-type region 132b disposed closest to the element active region 1 (bold arrows denoted by reference numerals "51" and "52"). The electric current 50 completely concentrates at a vicinity (hereinafter, referred to as "electric current concentration portion") 53 of the border between the third p$^-$-type region 132b disposed closest to the element active region 1 and the p-type well region 13c.

Thus, at the time of turning off, the current density is high (for example, about several hundred A/cm$^2$) in the electric current concentration portion 53, and the electric field strength in the depletion layer spreading in the electric current concentration portion 53 increases, causing avalanche breakdown (dynamic avalanche breakdown). Due to this avalanche breakdown, a hole current 54 is generated that flows from a vicinity of the electric current concentration portion 53 toward the source electrode 17. In this manner, a majority of the current concentrates at the electric current concentration portion 53, whereby breakdown may be caused in the non-active region 3.

On the other hand, in Example, the $n^{---}$-type surface region 32c isolates the p-type well region 13c and the third parallel pn structure 32 from each other in the depth direction. An electric current 40, which takes as current path, an n-type inversion layer formed in the p-type well region 13c during the ON state, flows through the first n-type region 12a that contacts the third $p^-$-type region 132b disposed closest to the element active region 1 and also flows toward the $n^{---}$-type surface region 32c between the p-type well region 13c and the third parallel pn structure 32 according to the potential.

Electric current 41 concentrating near a junction between the source electrode 17 and the p-type well region 13c is deconcentrated into electric current 42a that flows into the first n-type region 12a and electric current 42b that flows into the $n^{---}$-type surface region 32c. The electric current 42b that flows into the $n^{---}$-type surface region 32c flows into the plural third $n^-$-type regions 32a that constitute the third parallel pn structure 32.

The above deconcentration of the electric current 40 enables suppression of increases in the electric field strength at a corner portion vicinity 43 of the well bottom (the surface on the $n^+$-type drain layer 11 side) of the p-type well region 13c, at the time of turning off, and also enables the occurrence of dynamic avalanche breakdown to be prevented. A hole current 44 can therefore be sufficiently reduced, that flows from the corner portion vicinity 43 of the well bottom of the p-type well region 13c to the source electrode 17 through the p-type well region 13c. As a result, concentration of the current can be suppressed near the border between the third $p^-$-type region 32b disposed closest to the element active region 1 and the p-type well region 13c, and the occurrence of avalanche breakdown may be prevented in the non-active region 3. The occurrence of breakdown can therefore be prevented in the non-active region 3.

To cause an effect to be achieved that the electric current 42b flowing into the $n^{---}$-type surface region 32c is deconcentrated into the plural third $n^-$-type regions 32a, for example, the thickness of the $n^-$-type surface region 32c only has to be set as follows. For example, it is assumed that the electric current 42b flowing into the $n^{---}$-type surface region 32c spreads in the $n^{---}$-type surface region 32c at an angle θ of 45 degrees with respect to the depth direction from the corner portion of the well bottom of the p-type well region 13c.

A distance in a direction parallel to the depth direction from a pass point in the $n^{---}$-type surface region 32c of the electric current 42b to the upper end of the third $p^-$-type region 32b positioned under the pass point (on the side of the $n^+$-type drain layer) is assumed to be "X1". In this case, when the distance X1 is a dimension substantially equal to a width X2 of the third $p^-$-type region 32b (X1=X2·tan(45 degrees)=X2), the electric current 42b reaches the third $n^-$-type region 32a that is adjacent to the third $p^-$-type region 32b, on a side thereof that is away from the element active region 1.

The electric current 42b flowing through the $n^{---}$-type surface region 32c can be sufficiently deconcentrated in the third $n^-$-type region 32a by, for example, setting the width X2 of the third $p^-$-type region 32b to be 6 μm, and the thickness of the portion between the p-type well region 13c and the third parallel pn structure 32 of the $n^{---}$-type surface region 32c to be 8 μm. The thickness of the portion between the p-type well region 13c and the third parallel pn structure 32 of the $n^{---}$-type surface region 32c may be equal to or larger than the width X2 of the third $p^-$-type region 32b. The thickness of the $n^{---}$-type surface region 32c may be equal to or larger than the total of the thickness of the p-type well region 13c and the width X2 of the third $p^-$-type region 32b.

The effect achieved by disposing the $n^{---}$-type surface region 22c in the edge termination structure 2 can be described by replacing, in the above description, the third parallel pn structure 32, the third $n^-$-type region 32a, the third $p^-$-type region 32b, and the p-type well region 13c respectively with the second parallel pn structure 22, the second $n^-$-type region 22a, the second $p^-$-type region 22b, and the p-type well region 13b.

The isolation of the p-type well region 13b and the second parallel pn structure 22 from each other in the depth direction by the $n^{---}$-type surface region 22c can deconcentrate the electric current that takes the n-type inversion layer formed in the p-type well region 13b during the ON state, as a current path, to flow into the $n^{---}$-type surface region 22c, and the second $n^-$-type region 22a of the second parallel pn structure 22. Thus, a lower limit value of the thickness of the $n^{---}$-type surface region 22c is equal to that of the $n^{---}$-type surface region 32c.

Operation of the semiconductor device according to the embodiment will be described with reference to a comparison of differences between Example and Comparative Example in terms of the current paths formed near the border between the element active region 1 and the non-active region 3. In Comparative Example, during the ON state, for example, an n-type inversion layer is induced in the surface layer in the region immediately beneath the gate electrode 16 of the p-type well region 13c, and electrons are injected from the $n^+$-type source region 14 into the sandwiched region 12c between the p-type base region 13a and the p-type well region 13c, through the inversion layer.

Only the portion immediately beneath the gate electrode 16 of the element active region 1 becomes the current path as described. Consequently (see the electric currents 50, 51, and 52 depicted in FIG. 6), the electrons injected into the sandwiched region 12c reach the $n^+$-type drain layer 11 via the first n-type region 12a of the first parallel pn structure 12.

The inversion layer induced in the surface layer of the p-type well region 13c disappears at the time of turning off whereby positive voltage applied to the gate electrode 16 is removed. The depletion layer thereby starts to spread out from the pn junctions of the first and the third parallel pn structures 12 and 132. In this case, the spread of the depletion layer in the third parallel pn structure 132 is greater because the impurity concentration of the third parallel pn structure 132 is lower than the impurity concentration of the first parallel pn structure 12.

The current path of the electrons is thereby narrowed, and the current concentration of the carriers remaining in the semiconductor region tends to occur at the instant of the turning off (the switching from the ON state to the OFF state) as described. When the OFF state is established, the depletion layer completely spreads, increasing the electric field strength of the portion in which the current concentrates and thus, breakdown tends to occur.

On the other hand, in Example, during the ON state, for example, the n-type inversion layer is induced in the surface layer of the region immediately beneath the gate electrode 16 of the p-type well region 13c and electrons are injected from the $n^+$-type source region 14 into the sandwiched region 12c between the p-type base region 13a and the p-type well region 13c, via the inversion layer. The electrons injected into the sandwiched region 12c reach the $n^+$-type drain layer 11 via the first n-type region 12a of the first parallel pn structure 12 and the third n⁻-type region 32a of the third parallel pn structure 32.

As described, the portion immediately beneath the gate electrode 16 of the element active region 1 is taken as current paths (the electric currents 40, 41, and 42a depicted in FIG. 5), and the n⁻⁻⁻-type surface region 32c and the third n⁻-type region 32a are used as the current paths (the electric currents 40, 41, and 42b depicted in FIG. 5). The deconcentration of the electric current is determined by the impurity concentration (the specific resistance) of the n⁻⁻⁻-type surface region 32c.

At the time of turning off by which the positive voltage applied to the gate electrode 16 is removed, the inversion layer that is induced in the surface layer of the p-type well region 13c disappears. The depletion layer thereby starts to spread from the junctions of the first and the third parallel pn structures 13 and 32. Here, the depleting of the third parallel pn structure 32 does not yet start because the p-type well region 13c and the third parallel pn structure 32 are isolated from each other by the n⁻-type surface region 32c.

Thus, the current path of the electrons is not narrowed. The carriers remaining in the semiconductor region at the instant of the turning off flow into the third n⁻-type region 32a through the n⁻⁻⁻-type surface region 32c and occurrence of current concentration therefore may be prevented. Thereafter, the depletion layer extending from the pn junction between the p-type well region 13c and the n⁻⁻⁻-type surface region 32c reaches the third parallel pn structure 32 and the current path of the n⁻⁻⁻-type surface region 32c is thereby closed. The entrance of new carriers into the third parallel pn structure 32 is thereby suppressed.

Because the third parallel pn structure 32 has an impurity concentration distribution that is p-rich on the chip front surface side and n-rich on the chip back surface side, the depletion layer starts to gradually spread from the side of the chip front surface at turning off. Therefore, no carrier is left in the third n⁻-type region 32a. Furthermore, because the impurity concentration of the n⁻⁻⁻-type surface region 32c is lower than that of the third parallel pn structure 32 and the thickness thereof is equal to or smaller than ⅓ of the thickness of the first parallel pn structure 12, the depletion layer reaches the n⁺-type drain layer 11 at a low voltage during the OFF state. The occurrence of dynamic avalanche breakdown therefore may be prevented. Although the description has been made taking an example of the current path formed in a vicinity of the border between the element active region 1 and the non-active region 3, a similar current path is formed also in the vicinity of the border between the element active region 1 and the edge termination structure 2.

As described, according to the embodiment, by disposing the n⁻⁻⁻-type surface region between the p-type well region formed in a surface layer region on the chip front surface side immediately beneath the gate pad and the parallel pn structure disposed immediately beneath the gate pad, the p-type well region immediately beneath the gate pad and the parallel pn structure are isolated from each other. As a result, the electric current flowing through the p-type well region during the ON state can be deconcentrated into current for the portion immediately beneath the gate electrode and the n⁻-type region of the parallel pn structure immediately beneath the gate pad. Increase in the ON resistance can thereby be prevented. The deconcentration of the current path enables the concentration of current during the ON state to be prevented, and local increases in the electric field strength at the instant of switching from the ON state to the OFF state can be suppressed. The avalanche resistance of the non-active region such as that immediately beneath the gate pad can thereby be improved. The breakdown voltage of the non-active region can therefore be set to be higher than the breakdown voltage of the element active region. Degradation of the trade-off relation between the ON resistance and the breakdown voltage can be avoided.

Although the present invention has been described taking the example of the MOSFET, the same effect can be achieved for an IGBT, a bipolar transistor, an FWD, a Schottky diode, and the like. The present invention can be changed variously within a scope not departing from the spirit of the present invention and, in the embodiments, for example, the dimensions, the surface concentrations, and the like of the components are variously set according to required specifications and the like. Although the first conductivity type is assumed to be the n type and the second conductivity type is assumed to be the p type in the embodiments, the present invention is applicable when the first conductivity type is assumed to be the p type and the second conductivity type is assumed to be the m type.

According to the above invention, the second first conductivity type semiconductor region is disposed between the well region and the third parallel pn structure, whereby the well region and the third parallel pn structure are isolated from each other. Thus, the first vertical region of the first conductivity type of the first parallel pn structure can be used as a current path and the third vertical region of the first conductivity type of the third parallel pn structure can also be used as a current path. Increase of the ON resistance can thereby be prevented. Concentration of the current during the ON state can be avoided by the deconcentration of the current path, and local increase of the electric field strength occurring at the instant of the switching from the ON state to the OFF state can therefore be suppressed. The avalanche resistance can thereby be improved for a non-active region such as that immediately beneath the third electrode. The breakdown voltage of the non-active region can be set to be higher than the breakdown voltage of the element active region (the region having the active portion disposed therein).

According to the semiconductor device of the present invention, an effect is achieved in that the trade-off relation between the ON resistance and the breakdown voltage can be improved.

As described, the semiconductor device according to the present invention is useful for a high-voltage and large-current-capacity semiconductor device applicable to a MOSFET, an IGBT, a bipolar transistor, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device, comprising:
a substrate;
an active portion formed in the substrate on a first surface side thereof, for actively or passively passing current therethrough;
a first electrode electrically connected to the active portion;
a low-resistivity layer of a first conductivity type, formed in the substrate on a second surface side thereof;
a second electrode electrically connected to the low-resistivity layer;

a vertical drift portion formed in the substrate between the active portion and the low-resistivity layer, the vertical drift portion being configured to allow drift current to flow therethrough in a vertical direction during an ON state of the semiconductor device, and being depletable during an OFF state of the semiconductor device;

a first parallel pn structure formed in the vertical drift portion, the first parallel pn structure having a plurality of first junctions formed by repeatedly alternating, at a first repetition pitch, a first vertical region of the first conductivity type and a second vertical region of a second conductivity type, each of the first and second vertical regions being oriented in a thickness direction of the substrate;

a third electrode disposed on the substrate on the first surface side thereof via an insulation film;

a well region of the second conductivity type, formed in the substrate on the first surface side thereof and electrically connected to the first electrode, a part of the well region being underneath the third electrode via the insulation film;

a second parallel pn structure formed in the substrate above the low-resistivity layer, and being disposed contiguously with the first parallel pn structure, the second parallel pn structure having a plurality of second junctions formed by repeatedly alternating, at a second repetition pitch, a third vertical region of the first conductivity type and a fourth vertical region of the second conductivity type, each of the third and fourth vertical regions being oriented in the thickness direction of the substrate, the second repetition pitch being smaller than the first repetition pitch, a part of the second parallel pn structure being formed between the well region and the low-resistivity layer and disposed underneath the third electrode via the well region; and a semiconductor region of the first conductivity type, formed above the second parallel pn structure, a part of the semiconductor region being formed between the well region and the second parallel pn structure underneath the third electrode and separating the well region and the second parallel pn structure from each other, wherein the active portion comprising:
a base region of the second conductivity type formed on each second vertical region;
a source region of the first conductivity type selectively formed in each base region; and
a gate electrode disposed, via a gate insulation film, on the first surface side and between two adjacent source regions in a top view, and electrically connected with the third electrode.

2. The semiconductor device according to claim 1, wherein a thickness of the semiconductor region is at most ⅓ of a thickness of the first parallel pn structure.

3. The semiconductor device according to claim 1, wherein a thickness of the semiconductor region equals at least to a width of the fourth vertical region.

4. The semiconductor device according to claim 1, wherein an impurity concentration of the semiconductor region is lower than an impurity concentration of the third vertical region.

5. The semiconductor device according to claim 1, wherein
an end of the first electrode extends onto the insulation film, and
at least a portion of the first electrode is in proximity to the third electrode.

6. The semiconductor device according to claim 1, further comprising
an edge termination structure disposed in the substrate between the low-resistivity layer and a surface of the substrate on the first surface side thereof, at a periphery of the vertical drift portion, the edge termination structure being a non-current path region during the ON state of the semiconductor device and being depletable during the OFF state of the semiconductor device, wherein
the edge termination structure includes a third parallel pn structure having a plurality of third junctions formed by repeatedly alternating, at a third repetition pitch, a fifth vertical region of the first conductivity type and a sixth vertical region of the second conductivity type, each of the fifth and sixth vertical regions being oriented in the thickness direction of the substrate, the third repetition pitch being smaller than the first repetition pitch.

7. The semiconductor device according to claim 6, wherein the edge termination structure further comprises:
another third electrode disposed on the substrate on the first surface side thereof via another insulation film;
another well region of the second conductivity type, formed in the substrate on the first surface side thereof underneath said another third electrode via said another insulation film, said another well region being electrically connected to the first electrode; and
another semiconductor region of the first conductivity type, disposed between said another well region and the third parallel pn structure and separating said another well region and the third parallel pn structure from each other.

8. The semiconductor device according to claim 7, wherein a thickness of the another semiconductor region is at most ⅓ of a thickness of the first parallel pn structure.

9. The semiconductor device according to claim 7, wherein a thickness of the another semiconductor region equals at least to a width of the sixth vertical region.

10. The semiconductor device according to claim 7, wherein an impurity concentration of the another semiconductor region is lower than an impurity concentration of the fifth vertical region.

11. The semiconductor device according to claim 1, wherein the second vertical region of the first parallel pn structure and the well region contact each other.

12. A semiconductor device including an element active region and a non-active region, the element active region surrounding the non-active region in a top view of the semiconductor device, the element active region including a vertical drift portion that allows a drift current to flow therethrough in a vertical direction during an ON state of the semiconductor device, and that is depletable during an OFF state of the semiconductor device, the semiconductor device comprising:
a substrate having a first surface and a second surface that are opposite to each other;
an electrode disposed in the non-active region on the first surface of the substrate via an insulation film; and
a low-resistivity layer formed in the substrate at the second surface thereof, wherein the semiconductor device further includes:
in the element active region,
a first parallel pn repetition structure formed in the vertical drift portion above the low-resistivity layer, the first parallel pn repetition structure having a first region and a second region that are repeatedly alternated at a first repetition pitch, a base region of a second conductivity type formed on each second region, a source region of a first conductivity type selectively formed in each base region, and a gate electrode disposed, via a gate insulation film, on the first surface and between two adjacent source regions in the top view and electrically connected with the electrode; and in the non-active region, a well region formed in the substrate at the first surface thereof, and a second parallel pn repetition structure formed in the substrate between the well region and the low-resistivity layer, the second parallel pn repetition structure having a third region and a fourth region that are repeatedly alternated at a second repetition pitch that is smaller than the first repetition pitch, the well region and the second parallel pn repetition structure being separated from each other by a semiconductor region.

13. The semiconductor device of claim 12, wherein each of the low-resistivity layer, the first region and the third region is of the first conductivity type, and each of the well region, the second region and the fourth region is of the second conductivity type different from the first conductivity type.

14. The semiconductor device of claim 12, wherein each of the first, second, third and fourth regions is oriented in a thickness direction of the substrate.

\* \* \* \* \*